(12) United States Patent
Chang et al.

(10) Patent No.: US 9,198,286 B2
(45) Date of Patent: Nov. 24, 2015

(54) CIRCUIT BOARD AND ELECTRONIC ASSEMBLY

(71) Applicant: VIA Alliance Semiconductor Co., Ltd., Shanghai (CN)

(72) Inventors: Nai-Shung Chang, Shanghai (CN); Yun-Han Chen, Shanghai (CN); Chun-Yen Kang, Shanghai (CN); Tsai-Sheng Chen, Shanghai (CN)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/472,626

(22) Filed: Aug. 29, 2014

(65) Prior Publication Data
US 2015/0195906 A1 Jul. 9, 2015

(30) Foreign Application Priority Data

Jan. 9, 2014 (TW) .............................. 103100747 A

(51) Int. Cl.
| | |
|---|---|
| *H05K 1/00* | (2006.01) |
| *H05K 1/02* | (2006.01) |
| *H05K 1/11* | (2006.01) |

(52) U.S. Cl.
CPC .............. *H05K 1/0298* (2013.01); *H05K 1/111* (2013.01); *H05K 1/115* (2013.01); *H05K 2201/09227* (2013.01)

(58) Field of Classification Search
CPC ..... H05K 1/0298; H05K 1/111; H05K 1/115; H05K 2201/09227
See application file for complete search history.

(56) References Cited

U.S. PATENT DOCUMENTS

| | | | |
|---|---|---|---|
| 6,246,112 B1 * | 6/2001 | Ball et al. ...................... | 257/690 |
| 6,521,846 B1 | 2/2003 | Freda et al. | |
| 2005/0073050 A1 | 4/2005 | Chen | |
| 2013/0220690 A1 * | 8/2013 | Chang et al. .................. | 174/262 |
| 2014/0071646 A1 * | 3/2014 | Qian et al. ..................... | 361/777 |

FOREIGN PATENT DOCUMENTS

| | | |
|---|---|---|
| CN | 103298241 | 9/2013 |
| JP | 2003-69239 | 3/2003 |
| TW | I226693 | 1/2005 |

OTHER PUBLICATIONS

English language translation of abstract of JP JP2003-69239 (published Mar. 7, 2003).
English language translation of TW I226693 (published Jan. 11, 2005).

\* cited by examiner

*Primary Examiner* — Daniel Whalen
(74) *Attorney, Agent, or Firm* — McClure, Qualey & Rodack, LLP

(57) ABSTRACT

A circuit board including a first patterned conductive layer and a second patterned conductive layer isolated from the first patterned conductive layer is provided. The first patterned conductive layer has first signal traces and first ground traces. The second patterned conductive layer has second signal traces and second ground traces. An orthogonal projection of the second ground trace on the first patterned conductive layer partially overlaps at least one of the first signal traces. An orthogonal projection of the first ground trace on the second patterned conductive layer partially overlaps at least one of the second signal traces. An electronic assembly including the afore-described circuit board and a chip package connected thereto is also provided.

18 Claims, 5 Drawing Sheets

US 9,198,286 B2

CIRCUIT BOARD AND ELECTRONIC ASSEMBLY

CROSS-REFERENCE TO RELATED APPLICATION

This application claims the priority benefit of Taiwan application serial no. 103100747, filed on Jan. 9, 2014. The entirety of the above-mentioned patent application is hereby incorporated by reference herein and made a part of this specification.

BACKGROUND

1. Technical Field

The disclosure relates to a circuit board, and more particularly, to a circuit board and an electronic assembly.

2. Description of Related Art

In the field of electronic assembly, a rigid circuit board (hereinafter referred to as a circuit board) is a common carrier, which is configured to install electronic components (such as a chip package and passive components), so that these electronic components are capable of electrically connecting with each other through the inner circuit of the circuit board. The circuit board is commonly applied to a motherboard or a module board of an electronic device. The circuit board is mainly composed of a plurality of patterned conductive layers and a plurality of dielectric layers alternately stacked to one another. In addition, two patterned conductive layers can be electrically connected through a conductive via. The material of these dielectric layers may include resin.

The afore-described dielectric layer includes a core dielectric layer, which has a thickness several times than thicknesses of other dielectric layers, so as to provide a sufficient structural strength. As such, when a plurality of signal traces and a ground plane that the signal traces refer to are respectively located at two sides of the core dielectric layer, the core dielectric layer having a larger thickness increases the distance between the signal traces and the ground plane, resulting in ineffective reference effect of the ground plane for these signal traces. Thus, the impedance of the signal traces becomes inaccurate. Besides, the cross-talk caused by radiation adjacent to the signal traces may also affect the quality of signal transmission.

SUMMARY

The disclosure is directed to a circuit board, which has a fine signal transmission quality.

The disclosure is directed to an electronic assembly, which has a fine signal transmission quality.

A circuit board of the disclosure has a package bonding area. The circuit board includes a first patterned conductive layer and a second patterned conductive layer. The first patterned conductive layer has a plurality of first signal pads, a plurality of ground pads, a plurality of first signal traces and a plurality of first ground traces. The first signal pads and the first ground pads are located at the package bonding area. Each of the first signal traces extends to the package bonding area and connects to the corresponding first signal pad. Each of the first ground traces extends to the package bonding area and connects to the corresponding first ground pad. The second patterned conductive layer is isolated from the first patterned conductive layer, and has a plurality of second signal pads, a plurality of second ground pads, a plurality of second signal traces and a plurality of second ground traces. Each of the second signal traces extends to the package bonding area and connects to the corresponding second signal pad. Each of the second ground traces extends to the package bonding area and connects to the corresponding second ground pad. An orthogonal projection of the second ground trace on the first patterned conductive layer partially overlaps at least one of the first signal traces. An orthogonal projection of the first ground trace on the second patterned conductive layer partially overlaps at least one of the second signal traces.

An electronic assembly of the disclosure includes the afore-described circuit board and a chip package. The chip package is connected to a package bonding area of the circuit board.

According to the foregoing, in the disclosure, the ground traces are increased in the vicinity of the signal traces so as to obtain a fine reference effect, thereby enhancing the signal transmission quality.

In order to make the aforementioned and other features and advantages of the present application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DETAILED DESCRIPTION OF DISCLOSED EMBODIMENTS

Figure 1:
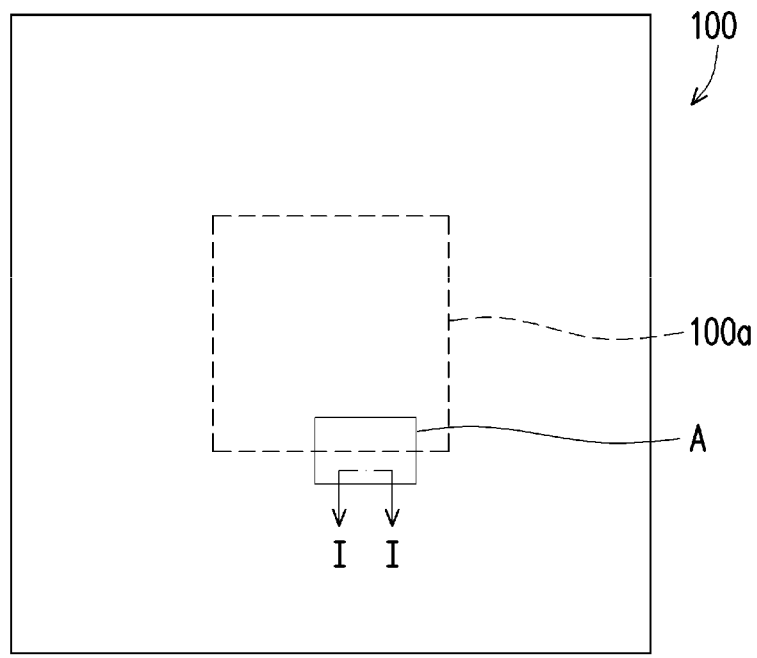
FIG. 1 is a top view illustrating a circuit board according to an embodiment of the disclosure.
Figure 2:
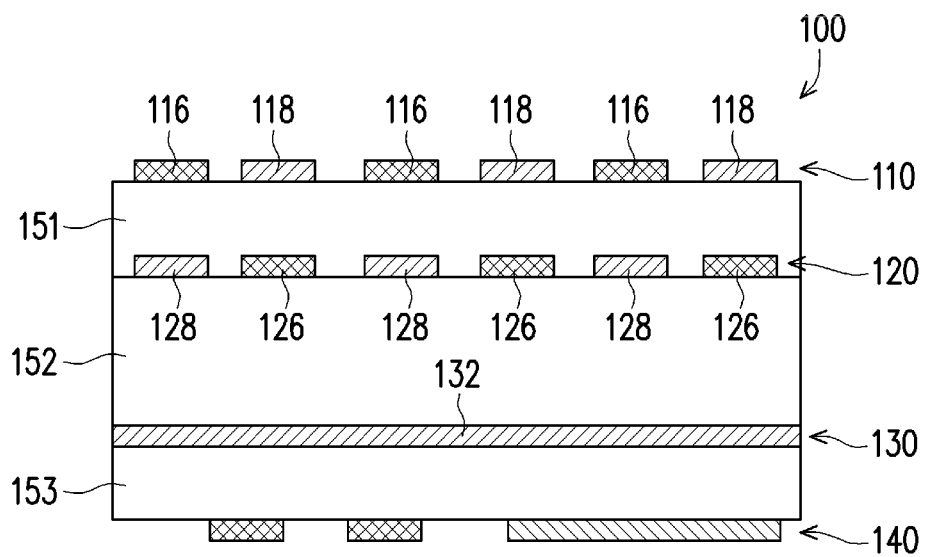
FIG. 2 is a cross-sectional view illustrating the circuit board depicted in FIG. 1 taken along line I-I.
Figure 3:
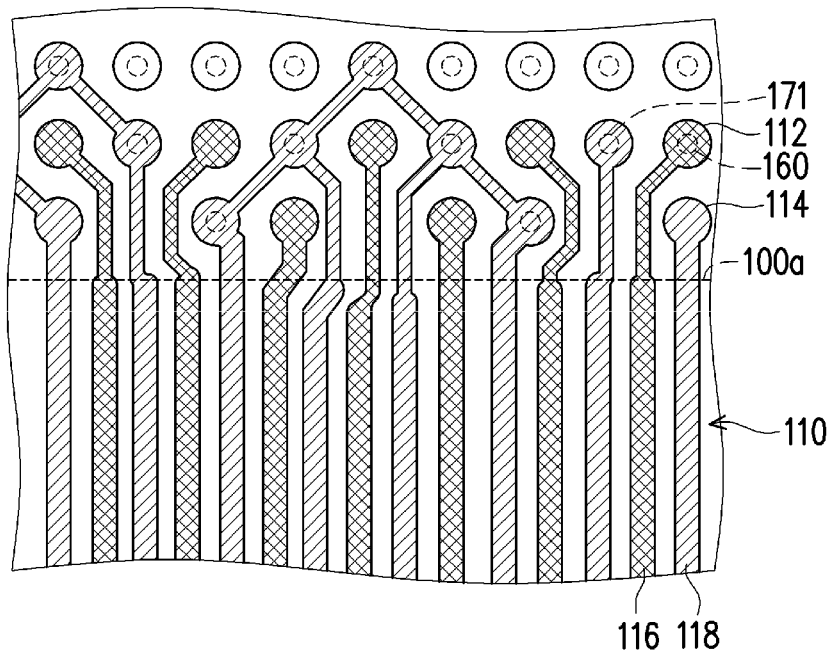
FIG. 3 illustrates a portion of the first patterned conductive layer in a region A of the circuit board depicted in FIG. 2.
Figure 4:
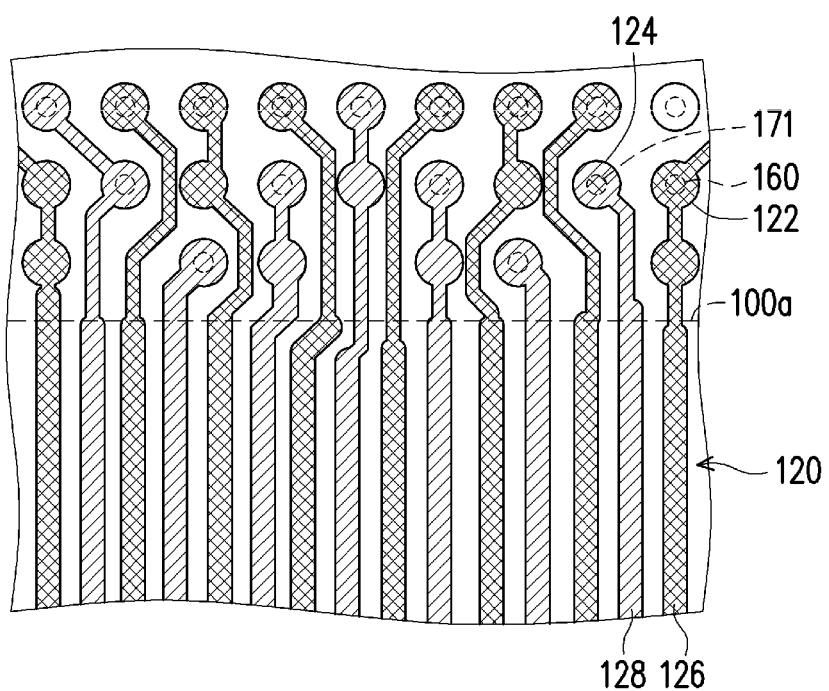
FIG. 4 illustrates a portion of the second patterned conductive layer in a region A of the circuit board depicted in FIG. 2.

FIG. 1 is a top view illustrating a circuit board according to an embodiment of the disclosure. FIG. 2 is a cross-sectional view illustrating the circuit board depicted in FIG. 1 taken along line I-I. FIG. 3 illustrates a portion of the first patterned conductive layer 110 in the circuit board depicted in FIG. 2. FIG. 4 illustrates a portion of the second patterned conductive layer 120 in the circuit board depicted in FIG. 2. Referring to FIG. 1 through FIG. 4, the circuit board 100 of the embodiment has a package bonding area 100a. The circuit board 100 includes a first patterned conductive layer 110, a second patterned conductive layer 120, a third patterned conductive layer 130 and a fourth patterned conductive layer 140. Moreover, the circuit board 100 further includes a first dielectric layer 151, a second dielectric layer 152 and a third dielectric layer 153. The first dielectric layer 151 is disposed between the first patterned conductive layer 110 and the second patterned conductive layer 120, and is configured to isolate the first patterned conductive layer 110 and the second patterned conductive layer 120. The second dielectric layer 152 is disposed between the second patterned conductive layer 120 and the third patterned conductive layer 130, and is configured to isolate the second patterned conductive layer 120 and the third patterned conductive layer 130. The second dielectric layer 152 is a core dielectric layer, and a thickness of the second dielectric layer 152 is greater than thicknesses of the first dielectric layer 151 and the third dielectric layer 153. Moreover, the third patterned conductive layer 130 has a ground plane 132. The third dielectric layer 153 is disposed between the third patterned conductive layer 130 and the fourth patterned conductive layer 140, and is configured to isolate the third patterned conductive layer 130 and the fourth patterned conductive layer 140.

Referring to FIG. 2 and FIG. 3, the first patterned conductive layer 110 has a plurality of first signal pads 112, a plurality of first ground pads 114, a plurality of first signal traces 116 and a plurality of first ground traces 118. The first signal pads 112 and the first ground pads 114 are located at the package bonding area 100a, and are configured to couple to a chip package. Each of the first signal traces 116 extends to the package bonding area 100a and connects to the corresponding first signal pad 112. Each of the first ground traces 118 extends to the package bonding area 100a and connects to the corresponding first ground pad 114. In the embodiment, the first signal traces 116 and the first ground traces 118 are alternately arranged.

Referring to FIG. 2 through FIG. 4, the second patterned conductive layer 120 has a plurality of second signal pads 122, a plurality of second ground pads 124, a plurality of second signal traces 126 and a plurality of second ground traces 128. Each of the second signal traces 126 extends to the package bonding area 100a and connects to the corresponding second signal pad 122. Each of the second ground traces 128 extends to the package bonding area 100a and connects to the corresponding second ground pad 124. In the embodiment, the second signal traces 126 and the second ground traces 128 are alternately arranged. It should be noted that, an orthogonal projection of the second ground trace 128 on the first patterned conductive layer 110 partially overlaps the first signal trace 116. An orthogonal projection of the first ground trace 118 on the second patterned conductive layer 120 partially overlaps the second signal trace 126. In an embodiment, on the extending directions of the first signal trace 116 and the second ground trace 128, the orthogonal projection of the second ground trace 128 on the first patterned conductive layer 110 completely overlaps the first signal trace 116. In an embodiment, on the extending directions of the first ground trace 118 and the second signal trace 126, the orthogonal projection of the first ground trace 118 on the second patterned conductive layer 120 completely overlaps the second signal trace 126. As such, under the circumstances that the first signal traces 116 and the second signal traces 126 are distanced relatively far away from the ground plane 132, the first signal traces 116 and the second signal traces 126 are still capable of referring to the first ground traces 118 and the second ground traces 128 respectively corresponded thereto where these ground traces are located on the adjacent layer, thereby obtaining a fine reference effect.

Figure 5:
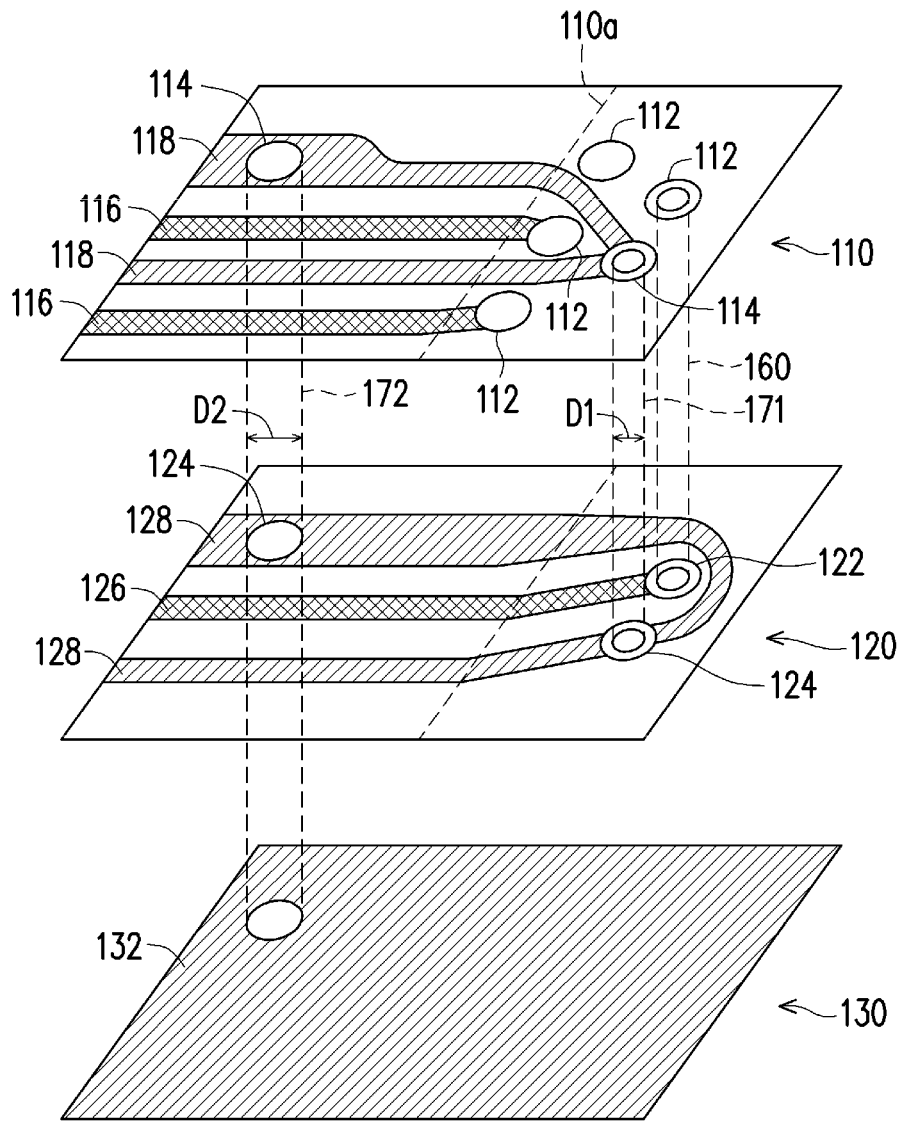
FIG. 5 is a partial perspective view illustrating patterned conductive layers of a circuit board according to another embodiment of the disclosure.

FIG. 5 is a partial perspective view illustrating patterned conductive layers of a circuit board according to another embodiment of the disclosure. Referring to FIG. 5, similar to the embodiments depicted in FIG. 1 through FIG. 4, the embodiment of FIG. 5 illustrates a portion of the first patterned conductive layer 110, a portion of the second patterned conductive layer 120 and a portion of the third patterned conductive layer 130, in the circuit board 100. Moreover, the embodiment of FIG. 5 further illustrates a signal conductive via 160, a first ground conductive via 171 and a second ground conductive via 172. The signal conductive via 160 connects the first signal pad 112 to the corresponding second signal pad 122. The first ground conductive via 171 is located in the package bonding area 100a, and connects the first ground pad 114 to the second ground pad 124. The second ground conductive via 172 is located outside the package bonding area 100a, and connects the first ground pad 114, the second ground pad 124 and the ground plane 132 together. It should be noted that, an outer diameter D1 of the first ground conductive via 171 is smaller than an outer diameter D2 of the second ground conductive via 172. This is due to the manufacturing process of the first ground conductive via 171 includes laser drilling with higher precision, whereas the manufacturing process of the second ground conductive via 172 includes mechanical drilling with lower precision. The denseness of the first ground conductive via 171 in the package bonding area 100a may be enhanced by employing various drilling processes at inside and outside the package bonding area 100a, thereby improving the coupling between the chip package and the circuit board. Moreover, since the size of the first ground conductive via 171 through laser drilling is smaller, the required area reserving for conductive vias is relatively small in the package bonding area 100a, such that the densities of the signal traces and the ground traces may be increased. In particular, conventionally, the signal traces are incapable of obtaining a preferable ground reference due to the density of the ground traces is relatively low in the package bonding area 100a, however, the configuration of the disclosure enhances the density of the ground traces through reducing the size of the first ground conductive via 171, thereby improving the transmission quality of signal traces.

Figure 6:
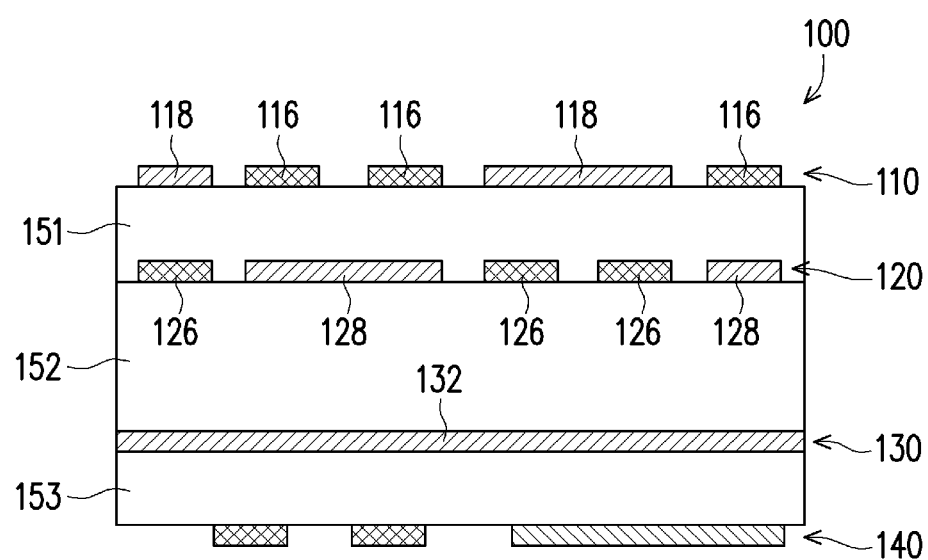
FIG. 6 is a partial cross-sectional view illustrating a circuit board according to another embodiment of the disclosure.

FIG. 6 is a partial cross-sectional view illustrating a circuit board according to another embodiment of the disclosure. Referring to FIG. 6, similar to the embodiment depicted in FIG. 2, the orthogonal projection of the second ground trace 128 having greater width on the first patterned conductive layer 110 partially overlaps the plurality of first signal traces 116. Moreover, the orthogonal projection of the first ground trace 118 having greater width on the second patterned conductive layer 120 partially overlaps the plurality of second signal traces 126.

Figure 7:
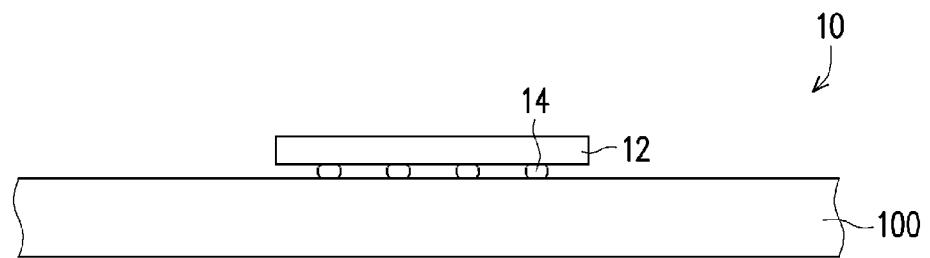
FIG. 7 is a side view illustrating an electronic assembly according to an embodiment of the disclosure.

FIG. 7 is a side view illustrating an electronic assembly according to an embodiment of the disclosure. Referring to FIG. 7, the electronic assembly 10 of the embodiment includes any one of the circuit boards 100 depicted in FIG. 1 through FIG. 6 and a chip package 12. The chip package 12 may be connected to the package bonding area 100a of the circuit board 100 through flip-chip bonding technique (such as solder balls 14).

Figure 8:
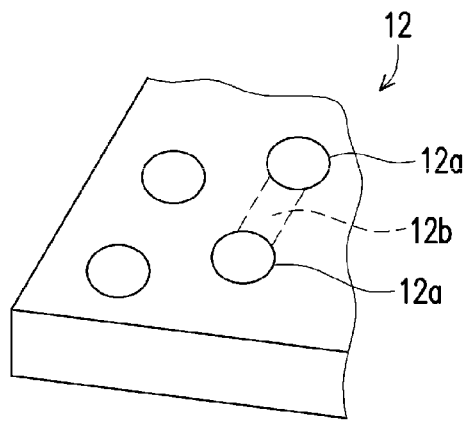
FIG. 8 is a bottom perspective illustrating a portion of a chip package depicted in FIG. 7.

FIG. 8 is a bottom perspective view illustrating a portion of a chip package depicted in FIG. 7. Referring to FIG. 8, the chip package 12 may include a package substrate and a chip installed on the package substrate, where FIG. 8 illustrates a portion of the package substrate. The chip package 12 has two package ground pads 12a and a package trace 12b connecting to the package ground pads 12a, in which each of the package ground pads 12a (such as, through the solder ball 14) is electrically connected to the corresponding ground pad (such as the first ground pads 114 depicted in FIG. 3 and FIG. 5). As such, under the designed circuit board of the disclosure, the package trace 12b connecting to the package ground pads 12a may also be referred as other adjacent signal paths. Moreover, the distribution density of the package ground pads 12a may also be increased through cooperating with the designed circuit board of the disclosure.

In light of the foregoing, the ground traces are increased on the same layer or adjacent layer as the signal traces in the disclosure, so as to obtain a fine reference effect, thereby enhancing the signal transmission quality. In the disclosure, by having the ground conductive vias to connect these ground traces and the ground plane together, and cooperating with the arrangement of the package ground pads in the electronic assembly, a fine reference effect may be obtained. In the disclosure, the package trace connecting to these package ground pads may also be referred as other adjacent signal paths.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A circuit board having a package bonding area, comprising:
    a first patterned conductive layer having a plurality of first signal pads, a plurality of first ground pads, a plurality of first signal traces and a plurality of first ground traces, wherein the first signal pads and the first ground pads are located at the package bonding area, each of the first signal traces extends to the package bonding area and connects to the corresponding first signal pad, and each of the first ground traces extends to the package bonding area and connects to the corresponding first ground pad;
    a second patterned conductive layer isolated from the first patterned conductive layer and having a plurality of second signal pads, a plurality of second ground pads, a plurality of second signal traces and a plurality of second ground traces, wherein each of the second signal traces extends to the package bonding area and connects to the corresponding second signal pad, and each of the second ground traces extends to the package bonding area and connects to the corresponding second ground pad, an orthogonal projection of the second ground trace on the first patterned conductive layer partially overlaps at least one of the first signal traces, and an orthogonal projection of the first ground trace on the second patterned conductive layer partially overlaps at least one of the second signal traces;
    a first ground conductive via located in the package bonding area and connecting the first ground pad to the second ground pad; and
    a second ground conductive via located outside the package bonding area and connecting the first ground pad to the second ground pad,
    wherein an outer diameter of the first ground conductive via is smaller than an outer diameter of the second ground conductive via.

2. The circuit board according to claim 1, wherein the first signal traces and the first ground traces are alternately arranged.

3. The circuit board according to claim 1, wherein the second signal traces and the second ground traces are alternately arranged.

4. The circuit board according to claim 1, wherein the first ground conductive via is a laser-drilled conductive via, and the second ground conductive via is a mechanical-drilled conductive via.

5. The circuit board according to claim 1, further comprising:
    a third patterned conductive layer isolated from the second patterned conductive layer and having a ground plane.

6. The circuit board according to claim 5, further comprising:
    a first ground conductive via located in the package bonding area and connecting the first ground pad to the second ground pad; and
    a second ground conductive via located outside the package bonding area and connecting the first ground pad, the second ground pad and the ground plane together,
    wherein an outer diameter of the first ground conductive via is smaller than an outer diameter of the second ground conductive via.

7. The circuit board according to claim 5, further comprising:
    a first dielectric layer disposed between the first patterned conductive layer and the second patterned conductive layer and configured to isolate the first patterned conductive layer and the second patterned conductive layer; and
    a second dielectric layer disposed between the second patterned conductive layer and the third patterned conductive layer and configured to isolate the second patterned conductive layer and the third patterned conductive layer,
    wherein a thickness of the second dielectric layer is greater than a thickness of the first dielectric layer.

8. The circuit board according to claim 7, further comprising:
    a fourth patterned conductive layer isolated from the third patterned conductive layer; and
    a third dielectric layer disposed between the third patterned conductive layer and the fourth patterned conductive layer and configured to isolate the third patterned conductive layer and the fourth patterned conductive layer.

9. The circuit board according to claim 1, wherein the circuit board is configured to couple a chip package located at the package bonding area, and the chip package has a plurality of package ground pads, which are respectively corresponded to the first ground pads.

10. An electronic assembly, comprising:
    a circuit board having a package bonding area and comprising:
    a first patterned conductive layer having a plurality of first signal pads, a plurality of first ground pads, a plurality of first signal traces and a plurality of first ground traces, wherein the first signal pads and the first ground pads are located at the package bonding area, each of the first signal traces extends to the package bonding area and connects to the corresponding first signal pad, and each of the first ground traces extends to the package bonding area and connects to the corresponding first ground pad;
    a second patterned conductive layer isolated from the first patterned conductive layer and having a plurality of second signal pads, a plurality of second ground pads, a plurality of second signal traces and a plurality of second ground traces, wherein each of the second signal traces extends to the package bonding area and connects to the corresponding second signal pad, and each of the second ground traces extends to the package bonding area and connects to the corresponding second ground pad, an orthogonal projection of the second ground trace on the first patterned conductive layer partially overlaps at least one of the first signal traces, and an orthogonal projection of the first ground trace on the second patterned conductive layer partially overlaps at least one of the second signal traces; and
a chip package coupled to the package bonding area of the circuit board;
a first ground conductive via located in the package bonding area and connecting the first ground pad to the second ground pad; and
a second ground conductive via located outside the package bonding area and connecting the first ground pad to the second ground pad, wherein an outer diameter of the first ground conductive via is smaller than an outer diameter of the second ground conductive via.

11. The electronic assembly according to claim 10, wherein the first signal traces and the first ground traces are alternately arranged.

12. The electronic assembly according to claim 10, wherein the second signal traces and the second ground traces are alternately arranged.

13. The electronic assembly according to claim 10, wherein the first ground conductive via is a laser-drilled conductive via, and the second ground conductive via is a mechanical-drilled conductive via.

14. The electronic assembly according to claim 10, wherein the circuit board further comprises:
a third patterned conductive layer isolated from the second patterned conductive layer and having a ground plane.

15. The electronic assembly according to claim 14, wherein the circuit board further comprises:
a first ground conductive via located in the package bonding area and connecting the first ground pad to the second ground pad; and
a second ground conductive via located outside the package bonding area and connecting the first ground pad, the second ground pad and the ground plane together,
wherein an outer diameter of the first ground conductive via is smaller than an outer diameter of the second ground conductive via.

16. The electronic assembly according to claim 14, wherein the circuit board further comprises:
a first dielectric layer disposed between the first patterned conductive layer and the second patterned conductive layer and configured to isolate the first patterned conductive layer and the second patterned conductive layer; and
a second dielectric layer disposed between the second patterned conductive layer and the third patterned conductive layer and configured to isolate the second patterned conductive layer and the third patterned conductive layer,
wherein a thickness of the second dielectric layer is greater than a thickness of the first dielectric layer.

17. The electronic assembly according to claim 16, wherein the circuit board further comprises:
a fourth patterned conductive layer isolated from the third patterned conductive layer; and
a third dielectric layer disposed between the third patterned conductive layer and the fourth patterned conductive layer and configured to isolate the third patterned conductive layer and the fourth patterned conductive layer.

18. The electronic assembly according to claim 10, wherein the chip package has a plurality of package ground pads and a package trace connecting to the package ground pads, and each of the package ground pads is electrically connected to the corresponding first ground pad.

* * * * *